United States Patent [19]

Jenkins et al.

[11] Patent Number: 4,952,915

[45] Date of Patent: Aug. 28, 1990

[54] FAILED ELECTRICAL COMPONENT DETECTOR FOR MULTIPHASE ELECTRIC MACHINES

[75] Inventors: Maurice A. Jenkins, Casselberry; Robert F. Gray, Winter Springs, both of Fla.

[73] Assignee: Westinghouse Electric Corp., Pittsburgh, Pa.

[21] Appl. No.: 193,868

[22] Filed: May 12, 1988

[51] Int. Cl.⁵ .......................................... G08B 21/00
[52] U.S. Cl. ..................... 340/639; 340/638; 340/815.31; 361/31; 310/68 B; 310/68 D
[58] Field of Search ........... 340/638, 639, 645, 815.31; 361/31, 104; 310/68 B, 68 D

[56] References Cited

U.S. PATENT DOCUMENTS

| | | | |
|---|---|---|---|
| 3,030,531 | 4/1962 | Lessmann | 361/31 |
| 3,532,873 | 10/1970 | Batson et al. | 340/815.31 |
| 3,866,196 | 2/1975 | Mann et al. | 340/638 |
| 4,349,813 | 9/1982 | Ishibashi et al. | 340/639 |
| 4,377,784 | 3/1983 | Saito et al. | 340/649 |
| 4,554,607 | 11/1985 | Mora | 340/639 |
| 4,565,998 | 1/1986 | Tsuji et al. | 340/639 |
| 4,635,044 | 1/1987 | South | 340/639 |
| 4,635,045 | 1/1987 | Miller et al. | 340/638 |

FOREIGN PATENT DOCUMENTS 0098903 4/1979 Japan ................................. 340/638

Primary Examiner—Joseph A. Orsino
Assistant Examiner—Jill Jackson

[57] ABSTRACT

A multiphase electric machine having a failed electrical component detector includes a rotating member and a plurality of electrical components carried by the rotating member and arranged in groups for conducting electrical current. A plurality of detectors is carried by the rotating member with each of the detectors responsive to one of the groups of electrical components for detecting component failures. A plurality of light emitting diodes are carried by the rotating member so as to be grouped into concentric circles according to electrical phase. Each of the light emitting diodes is responsive to one of the detectors such that a component failure, and the phase in which that failure occurs, can be observed by the naked eye. A stationary monitor is disposed about the rotating member and is responsive to the plurality of light emitting diodes for providing an indication of the number of component failures per phase.

15 Claims, 3 Drawing Sheets

FAILED ELECTRICAL COMPONENT DETECTOR FOR MULTIPHASE ELECTRIC MACHINES

BACKGROUND OF THE INVENTION

1. Field of the Invention:

The present invention is directed generally to a failed electrical component detector used in conjunction with an electric machine having a rotating member, and more particularly to a failed fuse detector used in conjunction with a brushless exciter.

2. Description of the Prior Art:

There are many kinds of multiphase electric machines having rotating members which carry electrical components, the failure of which must be detected. One example of such an electric machine is the brushless exciter. The basic function of a brushless exciter is to generate an alternating current and convert that current into a direct current that is used to produce the rotating field for an electrical generator. Rectification is accomplished through the use of multiple diode circuits which are rigidly mounted to the brushless exciter's rotor. For a six-phase wye system a minimum of six diodes is required. Typically, however, many more are used due to the necessity of providing spare legs, multiple pole designs and very high current requirements. Where high current capabilities are needed, many diodes are connected in parallel to reduce the current flow through each individual diode.

To protect such diodes from degradation due to overcurrent application, and to protect the exciter's operation from the effects of a shorted diode, designs typically include fuses series connected with the diodes. In applications that utilize many diode-fuse combinations in parallel, the failure of a single fuse may not have an adverse effect on the remaining diode-fuse combinations. Although each of the remaining parallel fuses will be required to carry an increased current load, this current is usually within the design capability of the fuse. However, a single fuse failure, while not adversely effecting the performance of the brushless exciter, cannot be ignored for long periods of time since the other fuses are working under a slight overcurrent condition and any subsequent fuse failure could have serious effects on the brushless exciter's ability to properly function. Thus, detection of fuse failure is important to enable the operator to shut the exciter down in an orderly fashion and replace the failed fuses. Furthermore, detection of fuse failure is critical if an entire phase of fuses fails thus requiring an immediate emergency shutdown of the system. For those reasons, it is important to be able to determine not only if any fuses have failed, but how many have failed and the specific locations in the circuit of those failures. Because brushless exciter rotors typically rotate at either 1800 RPM or 3600 RPM, inspections by an operator have heretofore been impossible without the aid of specially designed equipment.

There have been several attempts to design equipment for indicating failed fuses. One approach is disclosed in U.S. Pat. No. 4,635,045 which is directed to a Failed Fuse Detector And Detecting Method For Rotating Electrical Equipment. A current transformer is disposed about each fuse in such a way that it uses the conductor which carries current to the fuse as the primary winding of the current transformer. A light emitting diode is connected in series with the secondary winding of the current transformer. The emitted light, indicating a current flow through the fuse, is sensed by a stationary photodetector. Electronic circuitry is used to synchronize the detection operation with the rotation of the brushless exciter so that each fuse is inspected at a time when it is expected to be carrying its maximum current. Because this method looks for the existence of current through each fuse, it operates in a failsafe manner.

Another approach is disclosed in U.S. Pat. No. 3,866,196 which utilizes a projectile that, upon a fuse failure, is allowed to extend radially from the surface of the exciter rotor and be observed through the use of a stroboscopic light. A retaining wire holds the projectile in place. That retaining wire is connected electrically in parallel with the fuse. When the fuse fails, the current has to pass through the retaining wire causing it to overheat, rupture, and release the projectile. The idea of using a current path parallel to the fuse to activate a visible signal upon a fuse failure is also disclosed in U.S. Pat. No. 3,030,531. In that patent, instead of rupturing a retaining wire, the parallel current is used to activate a lamp which can be observed with a stroboscopic light.

A third approach is exemplified by U.S. Pat. No 4,635,044. The disclosed invention operates on the principal that, if a fuse is conducting an electric current, a magnetic field will exist around it and will move with the fuse as the exciter rotor rotates. That magnetic field can be remotely sensed by various devices and the conducting status of the fuse can be determined. Because any specific diode and its associated fuse do not conduct current during the entire 360° of the exciter rotor, means are provided to selectively activate fixed magnetic field sensors that are disposed about the rotor at locations where the various fuses are, by design, expected to have current flowing through them. Further, electronic circuitry allows for automatic display, alarm and shutdown sequences to be incorporated within the device.

In view of the intricacy associated with the prior art in failed fuse detectors for brushless exciters, the need exists for a failed fuse detector which requires minimal modification of the brushless exciter, requires no synchronization or sophisticated electronics, is reliable, and which provides a visual indication to the operator without the use of any specialized equipment.

SUMMARY OF THE PRESENT INVENTION

In its broadest application, the present invention includes a multiphase electric machine having a failed electrical component detector. The electric machine is comprised of a rotating member carrying a plurality of electrical components. The electrical components are arranged in groups for conducting electrical current. A plurality of detectors is also carried by the rotating member with each of the detectors being responsive to one of the groups of electrical components for detecting component failures. A plurality of light emitting diodes are carried by the rotating member so as to be grouped into concentric circles according to electrical phase. Each of the light emitting diodes is responsive to one of the detectors such that a component failure, and the phase in which that failure occurs, can be observed by the naked eye. Stationary sensors may be disposed about the rotating member which are responsive to the plurality of light emitting diodes for providing an indication of the number of component failures per electrical phase.

In a practical application of the present invention, the multiphase electric machine may take the form of a multiphase brushless exciter. The plurality of electrical components includes a plurality of series connected diodes and fuses arranged to rectify alternating multiphase current. In such an embodiment, the light emitting diodes are carried by the rotating member such that all of the light emitting diodes for each electrical phase are in a circle having a radius, measured from the axis of rotation of the rotating member, different from the radii of the circles for the other electrical phases. A plurality of sensors, at least equal in number to the number of electrical phases, are disposed about the rotating member such that each sensor is responsive to only the light emitting diodes of one of the electrical phases. A monitor, responsive to the sensors, may be provided for indicating the number of failures per electrical phase.

The present invention offers significant advantages over the prior art. First, the present invention requires minimal modification of the brushless exciter's rotor. Second, the detection circuits are constructed such that no synchronization with the brushless exciter's rotor is necessary. Only if the diode-fuse combination fails to conduct electrical current for more than one rotation of the rotor of the brushless exciter does the detection circuit cause its associated LED to be lighted. Because no sophisticated synchronization circuitry is needed, the detection circuits of the present invention may be constructed of simple and reliable components.

Because of the arrangement of the light emitting diodes into concentric circles equal in number to the number of electrical phases, the number of stationary sensors required is greatly reduced over that of the prior art. Instead of having a sensor for each fuse to be monitored, sensors are only needed for each electrical phase. Additionally, when a fuse failure occurs, the constantly lit LED, revolving at a speed of 1800 or 3600 RPM, will be seen by the operator as a circle of light. Thus, the operator can immediately determine, with the unaided eye, that at least one fuse has failed. Further, by knowing in which concentric circle the circle of light appears, because of the different colored LED's for each electrical phase, the operator can also determine, with the unaided eye, the phase in which the failure has occurred. The operator, by reviewing the monitor of the present invention, can get a determination of the number of fuses which have failed per phase. Thus, through the use of standard commercially available components, an extremely reliable system for determining the failure of electrical components can be constructed which can provide the operator with valuable information concerning the status of the electrical machine through a simple examination with the unaided human eye. These and other advantages and benefits of the present invention will become apparent from the Description Of A Preferred Embodiment hereinbelow.

BRIEF DESCRIPTION OF THE DRAWINGS

In order that the present invention may be easily understood and readily practiced, preferred embodiments will now be described, by way of example only, in conjunction with the figures wherein.

DESCRIPTION OF A PREFERRED EMBODIMENT

Figure 1:
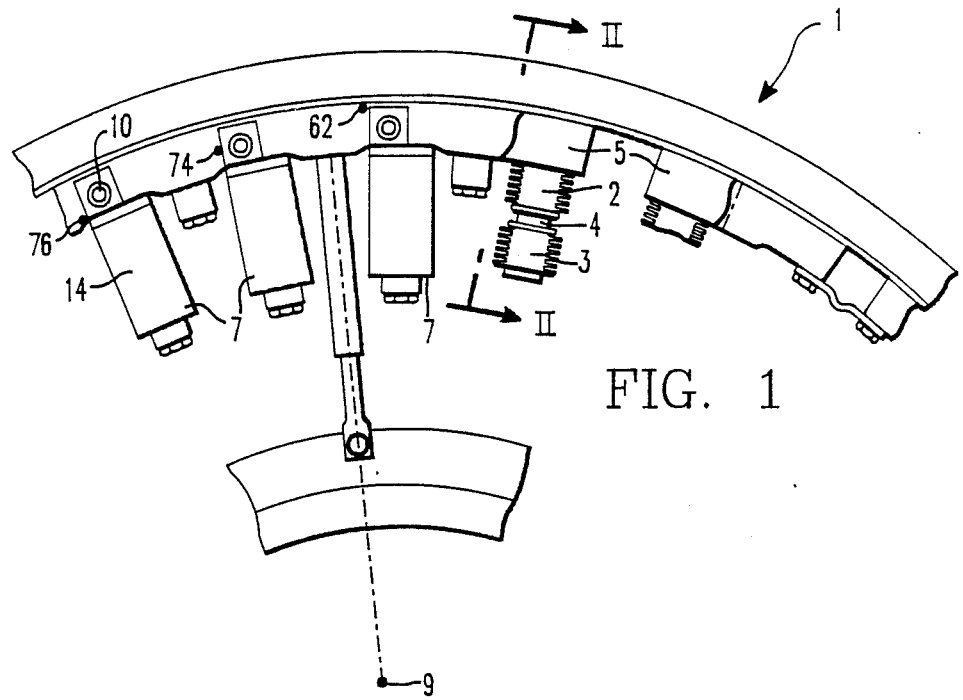
FIG. 1 illustrates a portion of a rotor of a brushless exciter carrying a plurality of rectifier modules.
Figure 2:
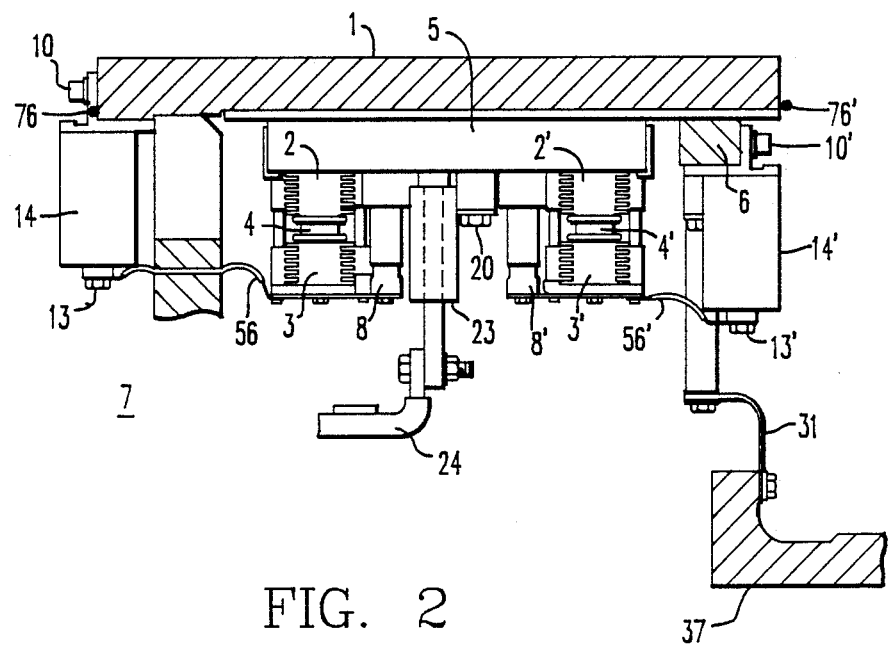
FIG. 2 is a side view of a rectifier module taken along the lines II—II in FIG. 1.

The present invention will now be described in conjunction with a brushless exciter, portions of which are shown in FIGS. 1 and 2. Although the present invention is described in conjunction with a brushless exciter, the principals of the present invention may be applied to any multiphase electric machine wherein electrical components carried by a rotating member must be monitored for failures. Thus, the brushless exciter shown and described is intended to be exemplary and not a limitation.

In FIG. 1, a rectifier wheel 1, which is the rotating member of the brushless exciter, is partially illustrated. The rectifier wheel 1 shown in FIGS. 1 and 2 is a conventional rectifier wheel which has been only slightly modified to accommodate the present invention. For that reason, the rectifier wheel 1 will not be described. It should be understood that such rectifier wheels are well known in the art and are currently commercially available.

The rectifier wheel 1 rotates about an axis of rotation 9 and carries a plurality of rectifier modules 7. Such rectifier modules are well known in the art and will therefore be only briefly described.

One of the modules 7 is shown in detail in FIG. 2. The module 7 has an outboard end, which is the left portion of the module shown in FIG. 2, and an inboard end, which is the right portion of the module shown in FIG. 2. The outboard and inboard portions of the module are substantially the same. For that reason, the same reference numerals have been applied to the components of the outboard and inboard portions of the module with the inboard components being additionally designated by the use of the prime symbol.

The outboard portion of the module carries an upper heat sink 2 and a lower heat sink 3 between which the exciter diode 4 is connected. A capacitor 5 is provided which operates in conjunction with a capacitor fuse 8. Fuse bolts 10 and 13 are used for mounting outboard fuse 14. The inboard fuse 14' additionally requires a fuse mounting block 6.

The module 7 is connected to the rectifier wheel by a module mounting bolt 20. Electrical power is provided to the module 7 through a phase lead 24 and a resistor 23. Electrical power is taken from the module 7 through a collector lead 31 and a collector 37.

Figure 3:
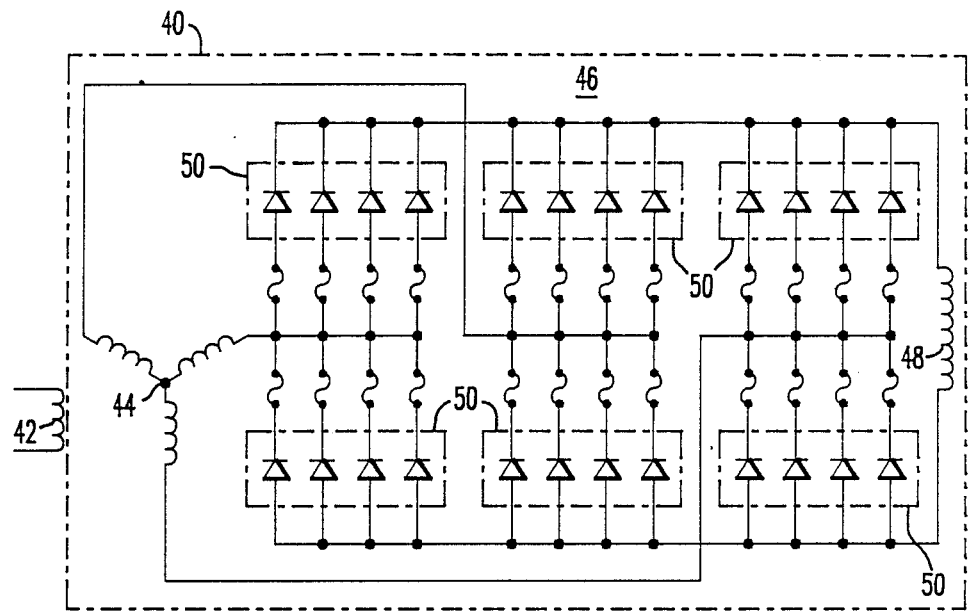
FIG. 3 is an electrical schematic of the exciter diode-fuse combinations used to rectify the multiphase alternating current.

Turning to FIG. 3, an electrical schematic illustrating the interconnection of the diodes and fuses carried by a typical rectifier wheel 40 is illustrated. FIG. 3 is a simplified schematic which illustrates the rotating components enclosed by a broken line. In FIG. 3, a field winding 42 provides a direct current field within which an armature carrying an armature winding 44 rotates thereby generating three-phase alternating current in the three-phase windings shown. The resulting alternating current is rectified by the rotating rectifier assembly 46 thereby applying direct-current to a field winding 48 which is part of a turbine generator rotor (not shown).

The rectifier assembly 46 consists of at least six diode groups 50 each consisting of four individual diodes arranged in parallel. The actual number of diode groups 50 depends upon the number of phases incorporated in the design of the brushless exciter. The number of individual diodes within each diode group 50 depends upon the current carrying requirement of the brushless exciter. Each individual diode is connected in series with a fuse for protection from overcurrent conditions.

Each diode 50 shown in FIG. 3 will be subjected to current flow for only 120 of mechanical rotation of the rectifier wheel 40. This total 120 conducting angle will be divided into as many smaller equal segments as there are pole pairs in the machine. For example, a six pole pair (12 pole) brushless exciter will subject each diode element to six periods of conduction which are 20 in duration and separated by 40 of nonconduction. Thus, current flows through each of the series connected diodefuse combinations for only a limited and predetermined number of degrees of rotation of the rectifier wheel 40. During the remainder of the rotation of the rectifier wheel 40, the series connected diode-fuse combination does not carry current.

Figure 4:
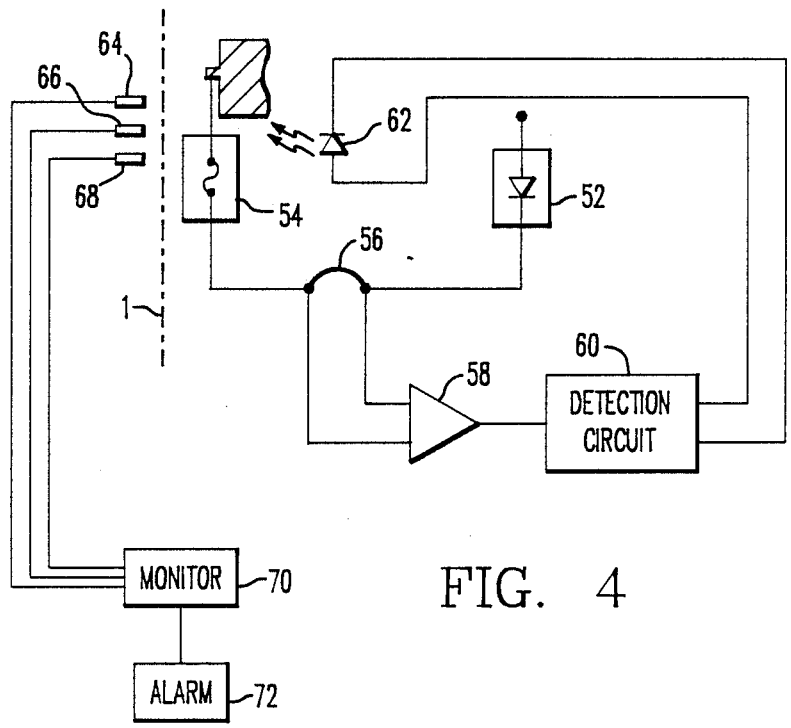
FIG. 4 is a block diagram illustrating the failed electrical component detector of the present invention in combination with one diode-fuse combination.

FIG. 4 is a block diagram illustrating the failed electrical component detector of the present invention in combination with an exciter diode 52 and its associated fuse 54. The reader will understand that for each exciter diode-fuse combination a separate failed electrical component detector is provided. The failed component detector is comprised of a shunt member 56 series connected between the exciter diode 52 and the exciter fuse 54. An operational amplifier 58 is responsive to the voltage drop across the shunt member 56 and hence the current flowing through the series combination of the exciter diode 52, the shunt member 56 and the exciter fuse 54.

The operational amplifier 58 produces a signal which changes state in response to, for example, current flowing through shunt member 56. That change in state is recognized by a detection circuit 60. The detection circuit 60 has a built in timer which times out a time period equal to the time it takes for the rectifier wheel 1 to make one revolution. If within that time period the signal of the operational amplifier 58 has not changed state indicating that current is flowing through shunt member 56, the detection circuit produces an output signal for energizing a light emitting diode 62.

The light emitting diode 62 is positioned on the inboard end of the rectifier wheel 1 as shown in FIG. 1. A similar LED may be positioned on the outboard end of the rectifier wheel 1. The positioning of the light emitting diode 62 is an important feature of the present invention. All of the light emitting diodes for a particular electrical phase are arranged along a circle having a predetermined radius measured from the axis of rotation 9 of the rectifier wheel 1. Each of the electrical phases is assigned a circle having a different radius thereby grouping all of the diodes associated with each of the electrical phases into that electrical phase's own unique circle. This results in a group of concentric circles with each circle carrying only LED's of the same electrical phase. For example, assuming LED 62 represents phase C of a three phase system, then an LED 74 representing phase B may be positioned along a circle having a smaller radius than the circle on which LED 62 is positioned. Similarly, an LED 76 representing phase A may be positioned along a circle having a smaller radius than either of the radii of the circles upon which the LED's 74 and 62 are positioned as shown in FIG. 1. In addition to providing spatial separation between the LED's of various phases, it may also be desirable to provide different colored LED's for each phase.

The detection circuit 60 is constructed such that should the shunt member 56 fail to conduct current after one complete rotation of the rectifier wheel 1, the LED 62 is constantly lit. Because of this, and the high speed of rotation of the rectifier wheel 1, the lit LED 62 will appear to the naked eye as a circle or band of light. Thus, the operator will know that a fuse has failed and, because of the color and/or location of that circle of light, will know in which phase the fuse has failed.

An additional feature of the present invention is provided by sensors 64, 66 and 68 operating in conjunction with monitor 70 and alarm 72. The sensors may be comprised of fiber optic pickups. The sensors 64, 66 and 68 are oriented so that each sensor is responsive to only one of the electrical phases. A separate group of sensors may be provided for the outboard end of the rectifier wheel 1. Thus, the number of sensors required is at least equal to the number of electrical phases.

Sensor 64 is responsive to all of the phase C LED's such as LED 62, sensor 66 is responsive to all the phase B LED's such as LED 74 while sensor 68 is responsive to all the phase A LED's such as LED 76. The monitor 70 receives input signals from the sensors 64, 66 and 68 which are in the form of pulses generated whenever a lighted LED passes one of the sensors. Counting such pulses over a period of time equal to the time it takes for the rectifier wheel 1 to make one complete revolution gives a count of the number of blown fuses per phase. This information can be used to sound an alarm 72 or take other appropriate action in the event that the number of blown fuses exceeds an acceptable amount.

Figure 5:
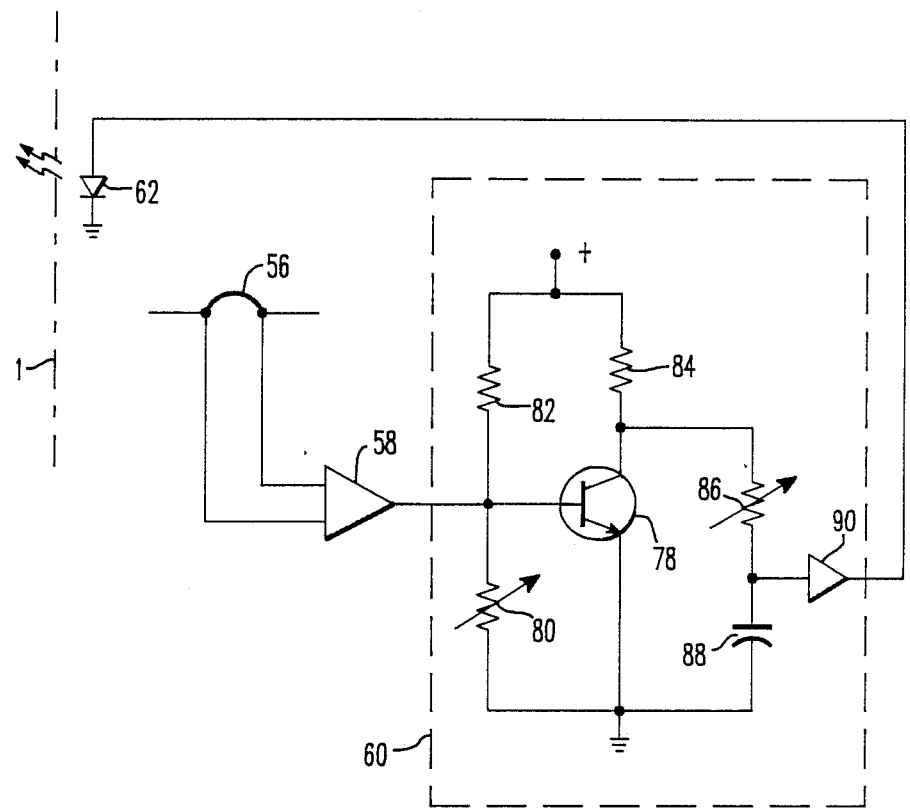
FIG. 5 illustrates the details of one embodiment of the detection circuit shown in FIG. 4.

One method of implementing the detection circuit 60 is shown in FIG. 5. The detection circuit 60 is comprised of a transistor 78 having a base terminal responsive to the operational amplifier 58. The base terminal is also connected to ground through a variable resistor 80 and connected to a positive voltage source through a resistor 82. A collector terminal of the transistor 78 is also connected to the positive voltage source through a resistor 84. The collector terminal is additionally connected to ground through the series combination of a variable resister 86 and a capacitor 88. The junction between the variable resistor 86 and the capacitor 88 is connected to an input terminal of an operational amplifier 90. The operational amplifier 90 produces a signal for driving the diode 62. The transistor 78 has an emitter terminal which is connected to ground.

In operation, the operational amplifier 90 produces an output signal for energizing the LED 62 whenever the capacitor 88 charges to a predetermined voltage, typically the supply voltage. The values of the resistors 84 and 86 are chosen such that one revolution of the rectifier wheel 1 is required before the capacitor 88 charges to the predetermined voltage. Under normal operating conditions, during one revolution of the rectifier wheel 1, the shunt member 56 will carry current for some portion of that revolution. When that occurs, operational amplifier 58 produces a signal which renders transistor 78 conductive. With transistor 78 in the conductive state, capacitor 88 discharges through variable resistor 86 and transistor 78 to ground. Thus, for each revolution, assuming shunt member 56 carries electrical current for at least a portion of that revolution, capacitor 88 is discharged such that operational amplifier 90 does not produce its output signal. However, should the fuse associated with shunt member 56 blow, no current will flow through shunt member 56. Because of the absence of current for one revolution, capacitor 88 will be allowed to charge to the supply voltage thereby causing operation amplifier 90 to produce its output signal to light LED 62. In this manner, the present invention provides a simple yet reliable method of indicating the failure of an electrical component. The circuitry of the present invention can be implemented with readily available off the shelf components. Additionally, no synchronization is required between the detection circuit 60 and the rotation of the rectifier wheel 1. This substantially simplifies the construction and operation of the present invention and enhances reliability.

In summary, the present invention presents substantial advantages over the prior art. First, an operator can determine with the unaided eye whether a fuse has blown and can also determine in which phase that fuse has blown. Secondly, through the use of the monitor, the operator can determine the number of fuses which have blown per phase. Third, because of the unique grouping of the LED's of the present invention, the number of sensors required is reduced. Rather than requiring a sensor for each LED as is found in the prior art, the number of sensors is reduced to at least the number of electrical phases to be monitored. Additionally, the present invention requires minimal modification of existing rectifier wheels. The only modification is the addition of the LED's. The only change to the modules 7 carried by the rectifier wheels is the provision of the shunt members 56. Once the shunt members 56 has been incorporated into the module, the operational amplifier 58 and the detection circuit 60 may be positioned on the module in any convenient location. The present invention provides a reliable and inexpensive method for monitoring component failures.

Those of ordinary skill in the art will recognize that many modifications and variations of the present invention are possible. For example, the electronic circuitry shown in FIG. 5 is only one example of how the detection circuit 60 may be implemented. The detection circuitry shown in FIG. 5 is intended to be exemplary and is not intended to be a limitation of the present invention. The description of the principals of the present invention in combination with the brushless exciter is also intended to be exemplary and not a limitation of the present invention. The following claims are intended to cover all modifications and variations of the present invention which will become apparent to those of ordinary skill in the art upon reading the above disclosure.

What we claim is:

1. A multiphase electric machine having a failed electrical component detector, comprising:
    a rotating member;
    a plurality of electrical components carried by said rotating member and arranged in groups for conducting electrical current;
    a plurality of detector means carried by said rotating member, each of said detector means responsive to one of said groups of electrical components for detecting component failure;
    a plurality of light emitting means carried by said rotating member so as to be grouped into concentric circles with each concentric circle of light emitting means having a different radius and being responsive to a different electrical phase, each of said light emitting means response to one of said detector means; and
    stationary means disposed about said rotating member and responsive to said plurality of light emitting means for providing an indication of component failures.

2. The electric machine of claim 1 wherein said plurality of electrical components includes a plurality of diodes and a plurality of fuses with each diode connected in series to one of said fuses to form one of said groups.

3. The electric machine of claim 2 additionally comprising a plurality of shunt members with each of said shunt members series connected between said diode and said fuse of one of said groups.

4. The electric machine of claim 3 wherein each of said detector means is responsive to the absence of current flow through one of said shunt members for a predetermined period of time, and wherein said detector means produces an output signal indicative of a component failure in response to said absence.

5. The electric machine of claim 4 wherein each of said detector means includes a transistor responsive to one of said shunt members and a capacitor, the voltage across said capacitor being controlled by said transistor.

6. The electric machine of claim 5 wherein each of said detector means includes drive means responsive to the voltage across said capacitor for producing a signal for driving one of said light emitting means.

7. The electric machine of claim 1 wherein the stationary means includes a monitor for counting the number of light emitting means energized per revolution of said rotating member.

8. The electric machine of claim 7 wherein the stationary means includes a plurality of light conductive members at least equal in number to the number of electrical phases, each of said light conductive members being responsive to one of said concentric circles for conducting light from said light emitting means grouped in that circle.

9. The electric machine of claim 1 wherein said light emitting means of each concentric circle are the same color within said circle but are a different color from the colors of said light emitting means of the other concentric circles.

10. A multiphase brushless exciter having a failed electrical component detector, comprising:
    a rotating member;
    a plurality of diodes carried by said rotating member and arranged to rectify alternating multiphase current;
    a plurality of fuses carried by said rotating member with each of said fuses electrically connected in series with one of said diodes;
    a plurality of detection circuits carried by said rotating member, each circuit responsive to one of said series connected diode-fuse combinations for detecting component failures;
    a plurality of light emitting diodes carried by said rotating member such that all of said light emitting diodes for each electrical phase are positioned along a circle having a radius different from the radii of the circles for the other electrical phases, each of said light emitting diodes being responsive to one of the detection circuits;
    a plurality of sensors at least equal in number to the number of electrical phases, said sensors disposed about said rotating member such that each sensor is responsive to only the light emitting diodes of one of said electrical phases; and monitor means responsive to said sensors for indicating the number of failures per electrical phase.

11. The exciter of claim 10 additionally comprising a plurality of shunt members with each of said shunt members series connected between one of said series connected diodes and fuses.

12. The exciter of claim 11 wherein each of said detection circuits is responsive to the absence of current flow through one of said shunt members for more than one revolution of said rotating member, and wherein said detection circuit produces an output signal indicative of a component failure in response to said absence.

13. The exciter of claim 12 wherein each of said detection circuits includes a transistor for conducting electrical current during periods of current flow through one of said shunt members, and a capacitor which is discharged when said transistor is conductive.

14. The exciter of claim 13 wherein each of said detection circuits includes drive means responsive to a predetermined voltage across said capacitor for producing said output signal for driving one of said light emitting diodes.

15. The exciter of claim 10 wherein the light emitting diodes for each electrical phase are a different color.

* * * * *